(12) United States Patent
Tanaka et al.

(10) Patent No.: US 6,614,376 B2
(45) Date of Patent: Sep. 2, 2003

(54) D/A CONVERTER CIRCUIT AND SEMICONDUCTOR DEVICE

(75) Inventors: Yukio Tanaka, Kanagawa (JP); Munehiko Azami, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/990,251

(22) Filed: Nov. 21, 2001

(65) Prior Publication Data

US 2002/0093443 A1 Jul. 18, 2002

(30) Foreign Application Priority Data

Nov. 24, 2000 (JP) .......................... 2000-357635

(51) Int. Cl.[7] .............................................. H03M 1/66
(52) U.S. Cl. ...................... 341/144; 341/154; 341/136; 341/150
(58) Field of Search ................................. 341/154, 144

(56) References Cited

U.S. PATENT DOCUMENTS

| | | | | |
|---|---|---|---|---|
| 4,200,863 | A | 4/1980 | Hodges et al. ............... | 340/347 |
| 4,713,649 | A | 12/1987 | Hino .......................... | 340/347 |
| 5,134,400 | A | 7/1992 | Hash .......................... | 341/136 |
| 5,274,373 | A | 12/1993 | Kanoh ........................ | 341/118 |
| 5,389,928 | A | 2/1995 | Coppero et al. ............ | 341/150 |
| 5,594,569 | A | 1/1997 | Konuma et al. ............ | 349/122 |
| 5,643,826 | A | 7/1997 | Ohtani et al. ............... | 437/88 |
| 5,923,962 | A | 7/1999 | Ohtani et al. ............... | 438/150 |
| 6,144,331 | A | 11/2000 | Jiang ........................... | 341/172 |
| 6,160,507 | A | * 12/2000 | Carbou et al. .............. | 341/144 |
| 6,271,783 | B1 | * 8/2001 | Cairns et al. ............... | 341/144 |
| 6,285,042 | B1 | 9/2001 | Ohtani et al. ............... | 257/66 |
| 6,329,940 | B1 | * 12/2001 | Dedic ......................... | 341/144 |
| 6,380,876 | B1 | * 4/2002 | Nagao ........................ | 341/144 |
| 6,417,793 | B1 | * 7/2002 | Bugeja et al. .............. | 341/144 |
| 6,445,323 | B1 | * 9/2002 | Cairns et al. ............... | 341/144 |
| 6,445,325 | B1 | * 9/2002 | Burns ......................... | 341/144 |
| 2002/0050938 | A1 | * 5/2002 | Tsukamoto .................. | 341/154 |

FOREIGN PATENT DOCUMENTS

| JP | 7-130652 | 5/1995 |
|---|---|---|
| JP | 11-167373 | 6/1999 |

OTHER PUBLICATIONS

Inui, S. et al, "Thresholdless Antiferroelectricity in Liquid Crystals and its Application to Displays," J. Mater. Chem., vol. 6, No. 4, pp. 671–673, 1996.

Yoshida, T. et al, "A Full–Color Thresholdless Antiferro-electric LCD Exhibiting Wide Viewing Angle with Fast Response Time," SID 97 Digest, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.

English abstract re Japanese patent application No. 7–130652, published May 19, 1995.

(List continued on next page.)

*Primary Examiner*—Michael Tokar
*Assistant Examiner*—Lam T. Mai
(74) *Attorney, Agent, or Firm*—Cook, Alex, McFarron, Manzo, Cummings & Mehler, Ltd.

(57) ABSTRACT

A D/A converter circuit capable of handling a high bit number digital signal, having good linearity, and having a small occupied surface area is provided. The D/A converter circuit has n−m+1 capacitors (where m is a natural number, and smaller than n), and the supply and discharge of electric charge to one of the capacitors from among the n−m+1 capacitors are controlled by the lower m bits of a digital video signal. The supply and discharge of electric charge to the remaining n−m capacitors, from among the n−m+1 capacitors, are controlled by the upper n−m bits, from among the n bits, of the digital video signal.

24 Claims, 12 Drawing Sheets

OTHER PUBLICATIONS

English abstract re Japanese patent application No. 11-167373, published Jun. 22, 1999.

U.S. patent application Ser. No. 10/106,924, to Tanaka et al., filed Mar. 25, 2002, including specification, abstract, claims, drawings and PTO filing receipt.

"A Capacitive Array & Resistance Strings Shape DAC," *The Fundation of MOS Integrated Circuit*, pp. 162–165, figs. 5–39, Kindai Kagaku Sha Co., Ltd., May 5, 1992, with English abstract of pp. 164–165 subheading iii.

* cited by examiner $$(C_T = C_L + C_U[1] + C_U[2] + \cdots + C_U[n-m-1] + C_U[n-m])$$

D/A CONVERTER CIRCUIT AND SEMICONDUCTOR DEVICE

BACKGROUND OF THE INVENTION

1. Field of the Invention

The present invention relates to a D/A converter (digital/analog converter) circuit (DAC). In particular, the present invention relates to a DAC used in a driver circuit of a semiconductor device. Further, the present invention relates to a semiconductor device using the DAC.

2. Description of the Related Art

Research and development of thin film transistors (TFTs) using polycrystalline silicon films formed on glass substrates as active layers has been advancing briskly in recent years. A TFT using a polycrystalline silicon film has a mobility which is two orders of magnitude or more higher than the mobility of a TFT that uses an amorphous silicon film, and therefore the electric current value necessary for circuit operation can be sufficiently maintained even if the gate width of the TFT becomes small and highly defined. Accordingly, it is possible to realize a "system on panel" in which a pixel portion of a matrix type flat panel display and a driver circuit are integrally formed on the same substrate.

Cost reductions are made possible with the "system on panel" because the number of fabricating steps and inspection steps of the display can be reduced. Further, it is possible to make the flat panel display smaller in size and with more high definition.

An issue relating to advances in making flat panel displays even smaller and higher definition is the realization of a DAC capable of high speed operation and occupying only a small amount of surface area on a substrate.

Several types of DACs exist, and capacitance divided types and resistance divided types can be given as typical. Compared to resistance divided DACs, capacitance divided DACs is capable of high speed operation with a relatively small surface area.

Shown in FIG. 11 is an example of a conventional capacitance divided DAC. The conventional capacitance divided DAC shown in FIG. 11 has n switches SW[1] to SW[n] controlled by each bit $D_1$ to $D_n$ of an n-bit digital signal, and n capacitors C, 2C, ..., $2^{n-1}$C, connected to each switch, and a reset switch $SW_R$. Further, an electric power source A (electric potential $V_A$) and an electric power source B (electric potential $V_B$) are connected to this conventional DAC. The electric power source A and the electric power source B are maintained at different electric potentials. Furthermore, the electric potential $V_{OUT}$ of an analog signal output from the DAC is imparted to an output line.

Corresponding bits of a digital signal are input to the switches SW[1] to SW[n], respectively. Selection of whether each of the capacitors is connected to the electric power source A or to the electric power source B is then made in accordance with information indicating 0 or 1 contained in the input digital signal.

Operation of the conventional DAC is explained in order. The conventional DAC can be explained by dividing it into reset periods $T_R$ and write in periods $T_A$.

First, the reset switch $SW_R$ is closed during a reset period $T_R$. Further, all of the switches SW[1] to SW[n] are connected to the same electric power source in accordance with a digital signal. It is assumed that they are connected to the electric power source A here. An equivalent circuit diagram of the conventional DAC immediately prior to the end of the reset period is shown in FIG. 12A. Note that reference symbol $C_A$ denotes the combined capacitance of all the capacitors.

A write in period $T_A$ begins after the reset period $T_R$ is complete, and each bit of the digital signal, which has the arbitrary 0 or 1 information, controls the switches SW[1] to SW[n]. Electric charges are then supplied to the n capacitors by each capacitor connecting to the electric power source A or the electric power source B in accordance with information in each bit. This then becomes a normal state. An equivalent circuit diagram for this point is shown in FIG. 12B. Note that the reference symbol $C_T$ denotes the combined capacitance of all the capacitors connected to the electric power source A, and that the reference symbol $C_B$ denotes the combined capacitance of the capacitors connected to the electric power source B.

By repeating the reset period $T_R$ and the write in period $T_A$ stated above, it is possible to convert the digital signal in to an analog signal.

As stated above, the capacitance divided DAC is capable of high speed operation with a relatively smaller surface area compared to a resistance divided DAC, and thus it is considered preferable in making flat panel displays smaller. However, if the number of bits of the digital signal is increased in order to make the flat panel display higher definition, it becomes difficult to suppress the amount of surface area occupied on the substrate, even with capacitance divided DACs.

If each capacitor of a capacitance divided DAC is designed with reduced size in order to reduce the occupied surface area, then the capacitor surface area corresponding to the lowest bit and its capacitance value become smaller. A small shift in the capacitance value develops due to causes such as shifts in the position of masks used during formation of the capacitor, patterning, and unforeseen parasitic capacitance. Therefore, if the capacitors are designed smaller, the ratio of shift in the capacitance value of the capacitor corresponding to the lowest bit becomes large, and it becomes difficult to form a capacitance divided DAC having good linearity.

Further, if the number of corresponding digital signal bits is increased with a resistance divided DAC, then not only does it become difficult to reduce the surface area, but the output resistance also becomes high, and high speed operation becomes difficult.

SUMMARY OF THE INVENTION

In view of the above stated problems, an object of the present invention is to manufacture a DAC capable of having a limited surface area, even if the number of digital signal bits is increased in order to a flat panel display further smaller in size of and have high definition, and which also has good linearity at high speed operation.

The applicants of the present invention considered using a resistance divided DAC or a selector circuit as a substitute for capacitors corresponding to the lower bits, which affect the inconsistent linearity of a capacitance divided DAC.

With the present invention, for example, one capacitor corresponding to the lower m bits of an n-bit digital signals $D_1$ to $D_n$ (m<n), and n−m capacitors corresponding to the upper n−m bits, are formed in a DAC corresponding to the n-bit digital signal. The one capacitor corresponding to the lower m bits of the digital signal is hereafter referred to as a lower bit correspondence capacitor ($C_L$), and the n−m capacitors corresponding to the upper n−m bits are hereafter referred to as upper bit correspondence capacitors ($C_U$).

The capacitance value of the lower bit correspondence capacitor is denoted by C (where C is a constant), and the capacitance values of the n−m upper bit correspondence capacitors are denoted by, in order from the lowest of the upper bits, $C_U[1]=C$, $C_U[2]=2C$, $C_U[3]=2^2C$, ..., $C_U[n-m-1]=2^{n-m-2}C$, and $C_U[n-m]=2^{n-m-1}C$.

The DAC of the present invention is connected to an electric power source A (electric potential $V_A$) and to an electric power source B (electric potential $V_B$) having different electric potentials. Electrical charging of the n−m upper bit correspondence capacitors by the two electric power sources is controlled by each bit of the upper n−m bits of the digital signal.

Further, the lower m bits of the digital signal are converted into analog in the resistance divided DAC, or selector circuit, corresponding to the lower m bits in the DAC of the present invention, and input to a lower bit output line as an analog signal corresponding to the lower bits (electric potential $V_L$). The lower bit correspondence capacitor is charged in accordance with the analog signal corresponding to the lower bits which is input to the lower bit output line.

The capacitors of the DAC of the present invention are all connected to one output line, and the electric potential of the output lines, namely the electric potential of the analog signal, is determined by the electric charge supplied to each capacitor in accordance with the information of 1 or 0 in each bit of the digital signal.

In accordance with the above structure, a DAC capable of handling a digital signal having a high number of bits without losing linearity can be formed, while maintaining advantages as the capacitance divided type, such as the ability to suppress the relative amount of surface area while operating at high speed, an advantage of capacitance division.

Structures of the present invention will be described below.

According to the present invention, there is provided a D/A converter circuit for converting n-bits digital signals (where n is a natural number) to analog signals, characterized in that:
  the D/A converter circuit has n−m+1 capacitors (where m is a natural number less than n);
  electrical charging of one capacitor from among the n−m+1 capacitors is controlled by the lower m bits, from among the n bits, of the digital signals; and
  electrical charging of the remaining n−m capacitors from among the n−m+1 capacitors is controlled by the upper n−m bits, from among the n bits, of the digital signals.

According to the present invention, there is provided a D/A converter circuit for converting n-bits digital signals (where n is a natural number) to analog signals, characterized in that:
  the D/A converter circuit has n−m+1 capacitors (where m is a natural number less than n);
  electrical charging of one capacitor, having a capacitance value of C (where C is a constant), from among the n−m+1 capacitors is controlled by the lower m bits, from among the n bits, of the digital signals;
  electrical charging of the remaining n−m capacitors from among the n−m+1 capacitors is controlled by the upper n−m bits, from among the n bits of the digital signals; and
  the remaining n−m capacitors have capacitance values expressed by C, 2C, $2^2C$, ..., $2^{n-m-1}C$, respectively.

According to the present invention, there is provided a D/A converter circuit for converting n-bits digital signals (where n is a natural number) to analog signals, characterized in that:
  the D/A converter circuit has n−m+1 capacitors (where m is a natural number less than n), and $2^m$ resistors;
  electric charges determined by the lower m bits of the digital signals, from among the n bits, and by the $2^m$ resistors are supplied to one capacitor from among the n−m+1 capacitors; and
  electric charges determined by the upper n−m bits of the digital signals, from among the n bits are supplied to the remaining n−m capacitors from among the n−m+1 capacitors.

According to the present invention, there is provided a D/A converter circuit for converting n-bits digital signals (where n is a natural number) to analog signals, characterized in that:
  the D/A converter circuit has n−m+1 capacitors (where m is a natural number less than n), and $2^m$ resistors;
  electric charges determined by the lower m bits of the digital signals, from among the n bits, and by the $2^m$ resistors are supplied to one capacitor from among the n−m+1 capacitors;
  the resistance values of all of the $2^m$ resistors are the same; and
  electric charges determined by the upper n−m bits of the digital signals, from among the n bits are supplied to the remaining n−m capacitors from among the n−m+1 capacitors.

According to the present invention, there is provided a D/A converter circuit for converting n-bits digital signals (where n is a natural number) to analog signals, characterized in that:
  the D/A converter circuit has n−m+1 capacitors (where m is a natural number less than n), and $2^m$ gradation voltage lines;
  one of the $2^m$ gradation voltage lines is selected by the lower m bits of the digital signals, from among the n bits, and electric charge is supplied to one capacitor having a capacitance value of C (where C is a constant), from among the n−m+1 capacitors, by the electric potential of the selected gradation voltage line;
  electric charging of the remaining n−m capacitors, from among the n−m+1 capacitors, is controlled by the upper n−m bits of the digital signals, from among the n bit digital signal; and
  the remaining n−m capacitors have capacitance values expressed by C, 2C, $2^2C$, ..., $2^{n-m-1}C$, respectively.

The present invention may have a feature such that the $2^m$ resistors are connected in series.

The present invention may have a feature such that the two resistors, from among the $2^m$ resistors, which have one terminal not connected to another resistor, are connected to a low voltage side electric power source, and to a high voltage side electric power source, respectively.

The present invention may have a feature such that the amount of electric charge supplied to the n−m+1 capacitors in a reset period is always maintained at a specific value.

The present invention may have a feature such that a semiconductor device includes the D/A converter circuit which is employed.

The present invention may have a feature such that the present invention is applied to: a display device; a digital still camera; a notebook personal computer; a mobile computer; a DVD player; a head mounted display; a video camera; or a portable telephone.

DETAILED DESCRIPTION OF THE PREFERRED EMBODIMENTS

Embodiment Mode 1

Figure 1:
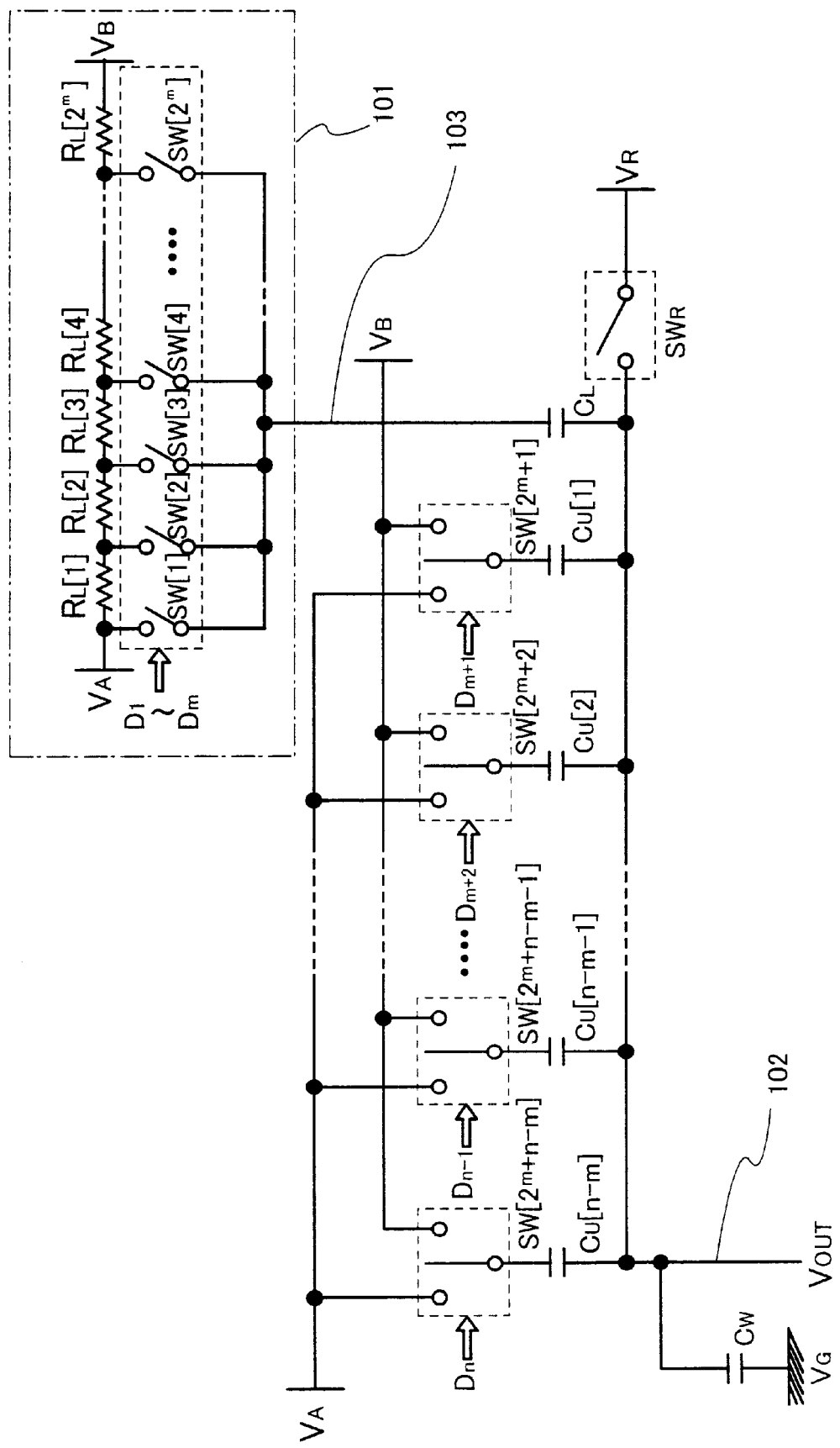
FIG. 1 is a diagram showing a structure of a DAC having the structure of the present invention.

A structure of a DAC of the present invention is shown in FIG. 1.

The DAC shown in FIG. 1 converts an n-bit digital signal into an analog signal by converting the lower m bits of the digital signal in a lower bit correspondence resistance divided DAC (R-DAC) 101 into an analog signal corresponding to the lower bits.

Further, the DAC has one lower bit correspondence capacitor ($C_L$) corresponding to the lower m bits, and n−m upper bit correspondence capacitors $C_U[1]$, $C_U[2]$, $C_U[3]$, ..., $C_U[n-m-1]$, and $C_U[n-m]$, which correspond to the upper n−m bits.

The capacitance value of the lower bit correspondence capacitor $C_L$ is denoted by $C_L=C$ (where C is a constant), and the capacitance values of the n−m upper bit correspondence capacitors $C_U$ are denoted by, in order from the lowest of the upper bits, $C_U[1]=C$, $C_U[2]=2C$, $C_U[3]=2^2C$, ..., $C_U[n-m-1]=2^{n-m-2}C$, and $C_U[n-m]=2^{n-m-1}C$.

Of the two electrodes of the lower bit correspondence capacitor $C_L$, one is connected to an output line 102, and the other is connected to a lower bit output line 103 of the resistance divided DAC 101 corresponding to the lower m bits of the digital signal (lower bit correspondence resistance divided DAC (R-DAC)).

The R-DAC 101 has $2^m$ resistors $R_L[1]$, $R_L[2]$, $R_L[3]$, ..., $R_L[2^m]$, and $2^m$ switches SW[1], SW[2], SW[3], ..., Sw[$2^m$].

The $2^m$ resistors all have the same resistance value, expressed by $R_L[1]=R_L[2]=R_L[3]=...R_L[2^m]=R$ (where R is a constant).

Further, the $2^m$ resistors $R_L[1]$, $R_L[2]$, $R_L[3]$, ..., $R_L[2^m]$ are all connected in series, and the resistors $R_L[1]$ and $R_L[2^m]$ positioned at the ends of the connection are connected to an electric power source A and an electric power source B, respectively.

The electric potential of the electric power source A and the electric potential of each resistor connected in series are connected to wirings so as to be imparted to the lower bit output line 103 through the $2^m$ switches SW[1], SW[2], SW[3], ..., Sw[$2^m$], respectively. Note that, differing from FIG. 1, the electric potential of the electric power source B and the electric potential of each resistor connected in series may also be connected to wirings so as to be imparted to the lower bit output line 103 through the $2^m$ switches SW[1], SW[2], SW[3], ..., Sw[$2^m$], respectively. Of the two electrodes of each of the upper bit correspondence capacitors, one of the electrodes is connected to the electric power source A or the electric power source B through, in order from the capacitor corresponding to the lowest of the upper n−m bits, the n−m switches SW[$2^m$+1], SW[$2^m$+2], ..., SW[$2^m$+n−m−1], SW[$2^m$+n−m], respectively. Further, the other electrodes are all connected to the output wiring 102.

In a write-in period, whether one of the electrodes of the upper bit correspondence capacitors is connected to the electric power source A or to the electric power source B is determined by information contained in each bit of the upper n−m bits input to the n−m switches SW[$2^m$+1], SW[$2^m$+2], ..., SW[$2^m$+n−m−1], SW[$2^m$+n−m], respectively.

Further, the output wiring 102 is connected to a reset electric power source through a reset switch $SW_R$. Note that the electric potential $V_R$ of the reset electric power source and the electric potential $V_A$ of the electric power source A may be the same, and they may also be different. Further, the electric potential $V_R$ of the reset electric power source and the electric potential $V_B$ of the electric power source B may be the same, and they may also be different. The reset switch $SW_R$ controls switching in accordance with a reset signal (Res).

Note that the output wiring 102 has a wiring capacitance ($C_W$), and that reference symbol $V_G$ denotes a ground electric potential. However, it is not always necessary that the wiring capacitance be formed between ground and the output wiring 102, but it may also be formed between an electric power source other than ground and the output wiring.

Figure 2:
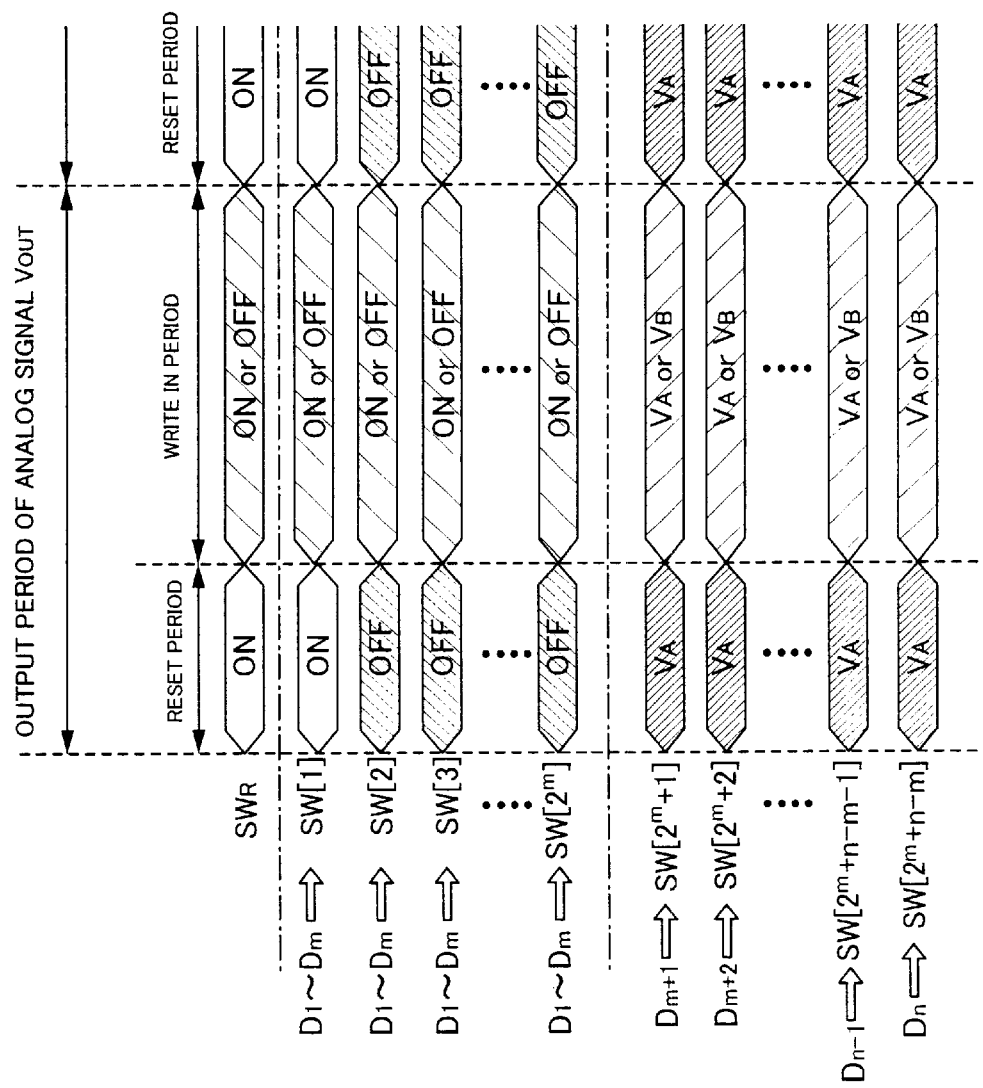
FIG. 2 is a diagram for explaining the operation of switches of a DAC of the present invention.

Operation of the DAC of the present invention shown in FIG. 1 is explained next, following the process order. Operation of the DAC of the present invention can be explained by dividing it into reset periods $T_R$ and write in periods $T_A$. Operation of each switch of the DAC of the present invention in the reset period $T_R$ and that in the write in period $T_A$ are shown in FIG. 2.

First, the reset switch $SW_R$ is turned on during the reset period $T_R$ by the reset signal (Res).

Further, of the $2^m$ switches SW[1], SW[2], SW[3], ..., Sw[$2^m$] of the R-DAC 101, only the switch SW[1] is turned on, and the remaining switches are all off, in accordance with the lower m bits of the digital signal.

In addition, the n−m switches SW[$2^m$+1], SW[$2^m$+2], ..., SW[$2^m$+n−m−1], SW[$2^m$+n−m] corresponding to the upper n−m bits are all connected to the electric power source A in accordance with the upper n−m bits of the digital signal.

Figure 3A:
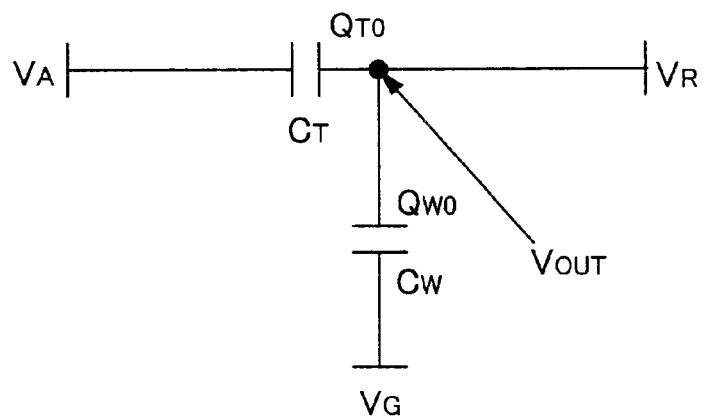
FIGS. 3A and 3B are equivalent circuit diagrams of DACs of the present invention.

An equivalent circuit diagram of the DAC of the present invention directly prior to completion of the reset period $T_R$ is shown in FIG. 3A. A capacitance $C_T$ corresponds to the combined capacitance of the lower bit correspondence capacitor $C_L$ and the capacitors $C_U[1]$, $C_U[2]$, ..., and $C_U[n-m]$ corresponding to all of the upper bits. The capacitance $C_T$ is expressed as shown in Eq. 1.

$$C_T = C_L + C_U[1] + C_U[2] + \ldots + C_U[n-m] = C + C + 2C + \ldots + 2^{n-m-1}C = 2^{n-m}C \quad [\text{Eq. 1}]$$

An electric charge $Q_{TO}$ accumulating in the combined capacitance $C_T$ is expressed by Eq. 2 below.

$$Q_{TO} = C_T(V_R - V_A) \quad [\text{Eq. 2}]$$

An electric charge $Q_{WO}$ accumulating in the wiring capacitance $(C_W)$ in the reset period $T_R$ is expressed by Eq. 3 below.

$$Q_{WO} = C_W \cdot (V_R - V_G) \quad [\text{Eq. 3}]$$

The write in period $T_A$ begins after the reset period $T_R$ is completed, and operation of the switches SW[1] to SW[$2^m$+n-m] is controlled in accordance with the digital signal.

First, operation of the m switches SW[1], SW[2], ..., SW[$2^m$-1], and Sw[$2^m$] corresponding to the lower m bits is controlled in accordance with lower m bits of the digital signal $D_1, D_2, \ldots, D_{m-1}, D_m$.

Specifically, the lower m bits of the digital signal $D_1$ to $D_m$ each have 1 or 0 information, and $2^m$ combinations of the 1 or 0 information of the lower m bit digital signals exist. Only one of the $2^m$ switches SW[1], SW[2], SW[3], ..., Sw[$2^m$] is selected in accordance with the $2^m$ combinations of the 1 or 0 information of the lower m bit digital signals, and is turned on.

The switch SW [t] (where $1 \leq t \leq 2^m$) is selected and turns on when the lower m bits of the digital signal $D_1$ to $D_m$ are imparted thereto. The relationship of Eq. 4 below is established with respect to the digital signals $D_1$ to $D_m$.

$$t = 1 + D_1 + 2D_2 + 2^2 D_3 + \ldots + 2^{m-1} D_m \quad [\text{Eq. 4}]$$

$$= 1 + \sum_{i=1}^{m} 2^{i-1} D_i$$

An electric potential $V_{LOUT}$ of the lower bit output line 103 is expressed by Eq. 5 below for cases in which the switch SW[t] (where $1 \leq t \leq 2^m$) is selected to be turned on. Note that $R_L[0]$ is defined to be equal to 0.

$$V_{LOUT} = \frac{(R_L[1] + \ldots + R_L[t-1])}{(R_L[1] + \ldots + R_L[2^m])} (V_B - V_A) + V_A \quad [\text{Eq. 5}]$$

The resistance values of the $2^m$ resistors $R_L[1]$, $R_L[2]$, $R_L[3]$, ..., $R_L[2^m]$ are all the same, and therefore Eq. 6 below is derived from Eq. 5.

$$V_{LOUT} = \frac{t-1}{2^m} (V_B - V_A) + V_A \quad [\text{Eq. 6}]$$

If Eq. 6 is substituted into Eq. 4, then the electric potential $V_{LOUT}$ imparted by Eq. 7 below and determined in accordance with the lower m bits $D_1$ to $D_m$ is imparted to the lower bit output line 103.

$$V_{LOUT} = \frac{\sum_{i=1}^{m} 2^{i-1} D_i}{2^m} (V_B - V_A) + V_A \quad [\text{Eq. 7}]$$

On the other hand, the n-m switches SW[$2^m$+1], SW[$2^m$+2], ..., SW[$2^m$+n-m-1], SW[$2^m$+n-m] corresponding to the upper n-m bits correspond to the n-m bits of the digital signal $D_{m+1}, D_{m+2}, \ldots, D_{n-1}$, and $D_n$ on a one to one basis, and their operation is controlled in accordance with the 0 or 1 information of each bit.

Specifically, one electrode of each of the upper bit correspondence capacitors $C_U[1]$, $C_U[2]$, ..., and $C_U[n-m]$ is connected to the electric power source A or to the electric power source B through the n-m switches SW[$2^m$+1], SW[$2^m$+2], ..., SW[$2^m$+n-m-1], SW[$2^m$+n-m]. The connection is made to the electric power source A when the bit information is 0, and to the electric power source B if the bit information is 1.

Figure 3B:
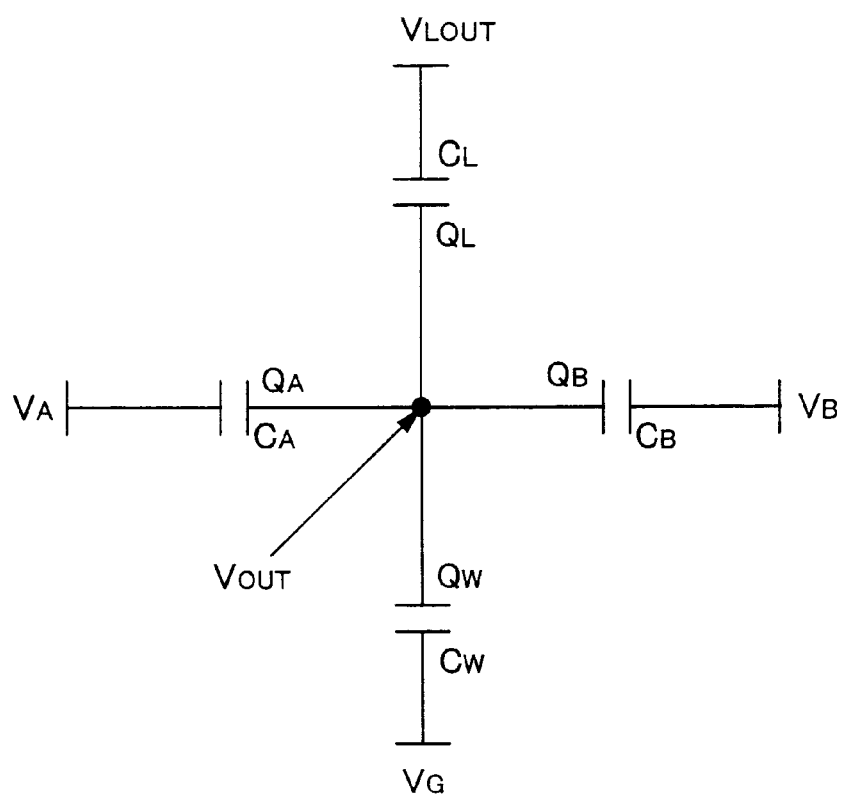

An equivalent circuit diagram of the DAC of the present invention directly prior to completion of the write in period $T_A$ is shown in FIG. 3B. Note that reference symbol $C_A$ denotes the combined capacitance of the capacitors connected to the electric power source A, and that reference symbol $C_B$ denotes the combined capacitance of the capacitors connected to the electric power source B, respectively among the upper bit correspondence capacitors.

The combined capacitances $C_A$ and $C_B$ are expressed by the following equations, Eq. 8 and Eq. 9.

$$C_A = \overline{D_{m+1}} C_U[1] + \overline{D_{m+2}} C_U[2] + \ldots + \overline{D_n} C_U[n-m] \quad [\text{Eq. 8}]$$

$$= \overline{D_{m+1}} \cdot C + \overline{D_{m+2}} \cdot 2C + \ldots + \overline{D_n} \cdot 2^{n-m-1} C$$

$$= C \sum_{i=m+1}^{n} 2^{i-m-1} \overline{D_i}$$

(When $D_i = 1$, $\overline{D_i} = 0$; when $D_i = 0$, $\overline{D_i} = 1$)

$$C_B = C \sum_{i=m+1}^{n} 2^{i-m-1} D_i \quad [\text{Eq. 9}]$$

Electric charge $Q_A$ accumulating in the capacitor $C_A$ during the write in period $T_A$ is expressed by Eq. 10 below.

$$Q_A = C_A \cdot (V_{OUT} - V_A) \quad [\text{Eq. 10}]$$

Electric charge $Q_B$ accumulating in the capacitor $C_B$ during the write in period $T_A$ is expressed by Eq. 11 below.

$$Q_B = C_B \cdot (V_{OUT} - V_B) \quad [\text{Eq. 11}]$$

Electric charge $Q_W$ accumulating in the wiring capacitance $C_W$ during the write in period $T_A$ is expressed by Eq. 12 below.

$$Q_W = C_W \cdot (V_{OUT} - V_G) \quad [\text{Eq. 12}]$$

Further, electric charge $Q_L$ accumulating in the lower bit correspondence capacitor $C_L$ during the write in period $T_A$ is expressed by Eq. 13 below.

$$Q_L = C_L \cdot (V_{OUT} - V_{LOUT}) \quad [\text{Eq. 13}]$$

A relationship shown by Eq. 14 below is formed between $C_A$ and $C_B$.

$$C_A + C_B = C \cdot (1 + 2 + 2^2 + \ldots 2^{n-m-1}) = C \cdot (2^{n-m} - 1) \quad [\text{Eq. 14}]$$

Eq. 15 below is established following principle of conservation of electric charge.

$$Q_{W0}+Q_{r0}=Q_W+Q_A+Q_B+Q_L \quad [\text{Eq. 15}]$$

Eq. 16 below is derived from Eqs. 1 to 15.

$$V_{OUT} = V_R + \frac{\sum_{i=1}^{n} 2^{i-1} D_i}{2^n + 2^m \cdot C_W/C}(V_B - V_A) \quad [\text{Eq. 16}]$$

Figure 4:
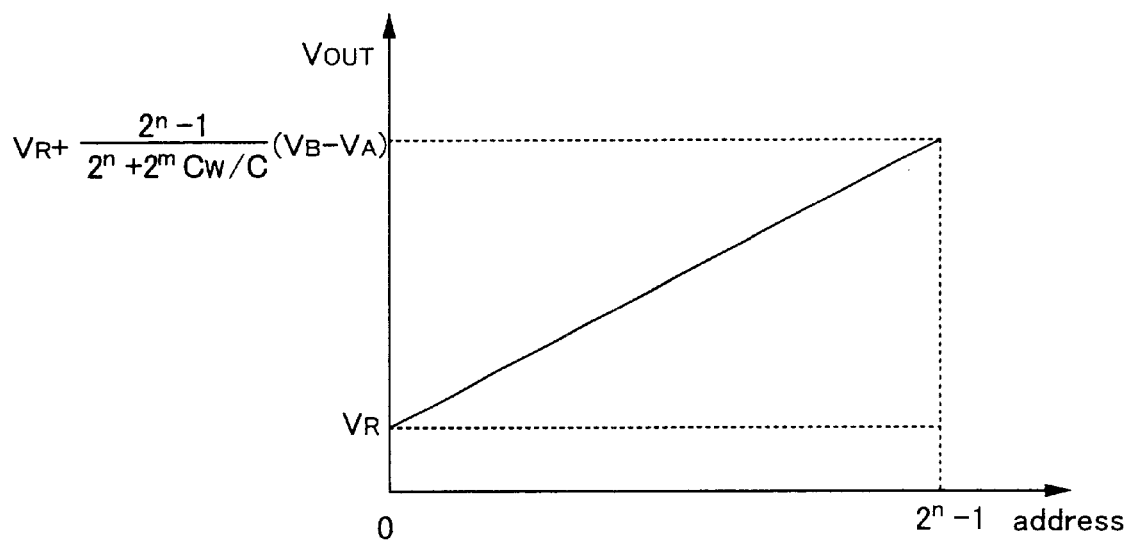
FIG. 4 is a diagram showing the relationship between the number of bits of a digital signal, and the electric potential of an output analog signal, in a DAC of the present invention.

The electric potential of the analog signal with respect to the n bit digital signal is shown in a graph in FIG. 4. An electric potential $V_{OUT}$ of an analog signal having linearity with respect to the input n-bit digital signal is imparted to an output wiring, as shown in FIG. 4.

It is possible to convert an n-bit digital signal into an analog signal by performing the reset period $T_R$ and the write in period $T_A$ in succession.

In accordance with the above structure, a DAC corresponding to a digital signal having a high number of bits can be formed, without losing linearity, while maintaining an advantage of capacitance division to suppress the relative amount of surface area, while operating at high speed.

Note that, in a case in which the wiring is connected such that the electric potential of the electric power source B and the electric potential of each resistor connected in series are imparted to a lower bit output line 103 through the $2^m$ switches SW[1], SW[2], SW[3], . . . , and Sw[$2^m$], respectively, differing from FIG. 1, $V_{OUT}$ is expressed by Eq. 17 below.

$$V_{OUT} = V_R + \frac{1+\sum_{i=1}^{n} 2^{i-1} D_i}{2^n + 2^m \cdot C_W/C}(V_B - V_A) \quad [\text{Eq. 17}]$$

Eq. 16 or Eq. 17 is appropriately selected in accordance with the connection of wiring.

Embodiment Mode 2

A structure of a DAC of the present invention which uses a selector circuit as a substitute for an R-DAC is explained in Embodiment Mode 2.

Figure 5:
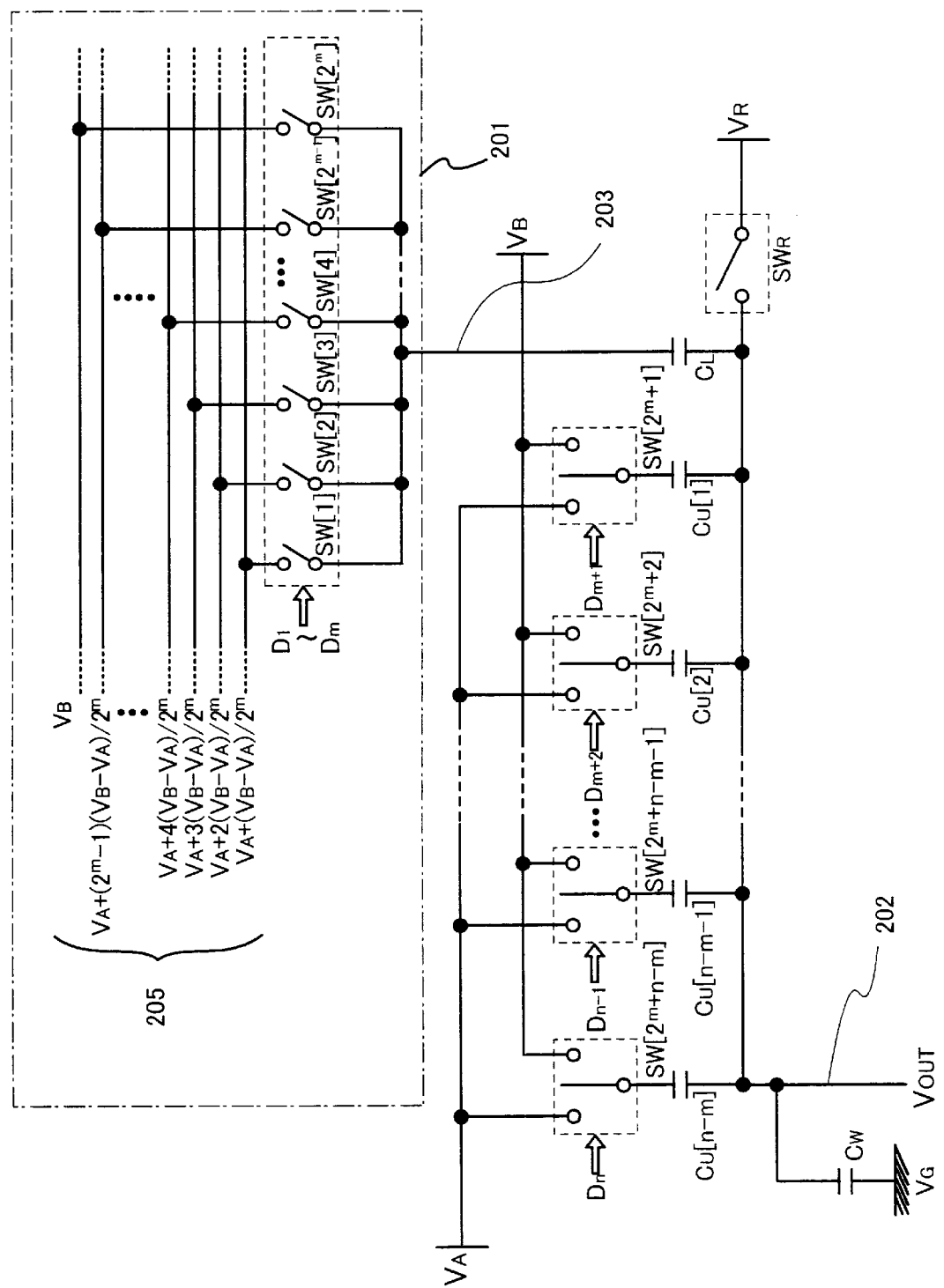
FIG. 5 is a diagram showing a structure of a DAC having the structure of the present invention.

A structure of a DAC of the present invention using a selector circuit is shown in FIG. 5. The DAC shown in FIG. 5 converts an n-bit digital signal into an analog signal by converting the lower m bits of the digital signal in a lower bit correspondence selector circuit 201 into an analog signal corresponding to the lower bits.

Further, the DAC has one lower bit correspondence capacitor ($C_L$) corresponding to the lower m bits, and n-m upper bit correspondence capacitors $C_U[1]$, $C_U[2]$, $C_U[3]$, . . . , $C_U[n-m-1]$, and $C_U[n-m]$ corresponding to the upper n-m bits.

The capacitance value of the lower bit correspondence capacitor $C_L$ is denoted by $C_L=C$ (where C is a constant), and the capacitance values of the upper bit correspondence capacitors $C_U$ are denoted by, in order from the lowest of the upper bits, $C_U[1]=C$, $C_U[2]=2C$, $C_{U[3]}=2^2C$, . . . , $C_U[n-m-1]=2^{n-m-2}C$, and $C_U[n-m]=2^{n-m-1}C$.

Of the two electrodes of the lower bit correspondence capacitor $C_L$, one is connected to an output line 202, and the other is connected to a lower bit output line 203 of the lower bit correspondence selector circuit 201.

The lower bit correspondence selector circuit 201 has $2^m$ gradation voltage lines 205, and $2^m$ switches SW[1], SW[2], SW[3], . . . , SW[$2^m$].

The electric potentials of the $2^m$ gradation voltage lines 205 are expressed by $V_A+(V_B-V_A)/2^m$, $V_A+2(V_B-V_A)/2^m$, $V_A+(3V_B-V_A)/2^m$, . . . , $V_A+(2^m-1)(V_B-V_A)/2^m$, $V_B$, respectively.

Further, the wirings are connected such that the electric potentials of each of the gradation voltage lines 205 are imparted to the lower bit output line 203 through the $2^m$ switches SW[1], SW[2], SW[3], . . . , Sw[$2^m$], respectively.

Of the two electrodes of each of the upper bit correspondence capacitors, one of the electrodes is connected to an electric power source A or an electric power source B through, in order from the capacitor corresponding to the lowest of the upper n-m bits, the n-m switches SW[$2^m+1$], SW[$2^m+2$], SW[$2^m+n-m-1$], SW[$2^m+n-m$], respectively.

Further, the other electrodes are all connected to the output wiring 202.

Whether one of the electrodes of the upper bit correspondence capacitors is connected to the electric power source A or to the electric power source B is determined by information contained in each bit of the upper n-m bits input to the n-m switches SW[$2^m+1$], SW[$2^m+2$], . . . , SW[$2^m+n-m-1$], SW[$2^m+n-m$], respectively.

Further, the output wiring 202 is connected to a reset electric power source through a reset switch $SW_R$. Note that the electric potential $V_R$ of the reset electric power source and the electric potential $V_A$ of the electric power source A may be the same, and they may also be different. Further, the electric potential $V_R$ of the reset electric power source and the electric potential $V_B$ of the electric power source B may be the same, and they may also be different. The reset switch $SW_R$ controls switching in accordance with a reset signal (Res).

Note that the output wiring 202 has a wiring capacitance ($C_W$), and that reference symbol $V_G$ denotes a ground electric potential. However, it is not always necessary that the wiring capacitance be formed between ground and the output wiring 202, but it may also be formed between an electric power source other than ground and the output wiring.

Next, operation of the DAC of the present invention shown in FIG. 5 can be explained by dividing it into reset periods $T_R$ and write in periods $T_A$. The operation of each switch is the same as that shown by Embodiment Mode 1, and therefore its explanation is omitted here. The electric potential of the analog signal input to the output line has linearity with respect to the digital signal bits by having the digital signal control the operation of each switch.

In accordance with the above structure, a DAC corresponding to a digital signal having a high number of bits can be formed, without losing linearity, while maintaining an advantage of capacitance division to suppress the relative amount of surface area, while operating at high speed.

Embodiments of the present invention are explained below.

Embodiment 1

A case in which m =2 in the DAC of the present invention shown in FIG. 1 is explained in Embodiment 1.

Figure 6:
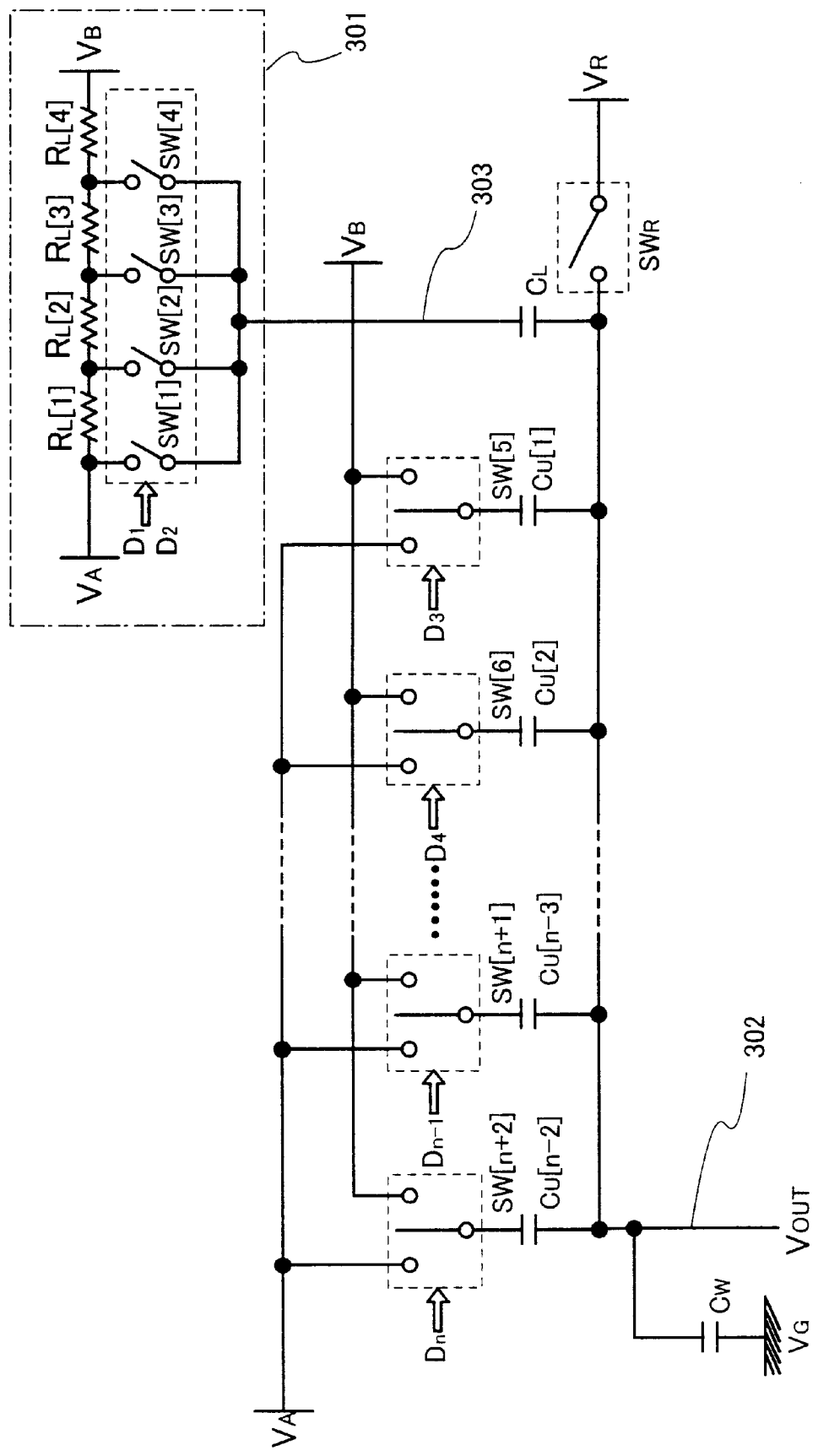
FIG. 6 is a diagram showing a structure of a DAC having the structure of Embodiment 1.

A structure of a DAC of Embodiment 1 is shown in FIG. 6. The DAC shown in FIG. 6 converts an n-bit digital signal into an analog signal by converting the lower 2 bits of the digital signal in a lower bit correspondence resistance divided DAC 301 into an analog signal corresponding to the lower bits.

The DAC has one lower bit correspondence capacitor ($C_L$) corresponding to the lower 2 bits, and n-2 upper bit correspondence capacitors $C_U[1]$, $C_U[2]$, $C_U[3]$, ..., $C_U[n-3]$, and $C_U[n-2]$ corresponding to the upper n−2 bits.

The capacitance value of the lower bit correspondence capacitor $C_L$ is denoted by $C_L$=C (where C is a constant), and the capacitance values of the upper bit correspondence capacitors $C_U$ are denoted by, in order from the lowest of the upper bits, $C_U[1]$=C, $C_U[2]$=2C, $C_U[3]$=$2^2$C, ..., $C_U[n-3]$=$2^{n-4}$C, and $C_U[n-2]$=$2^{n-3}$C.

Of the two electrodes of the lower bit correspondence capacitor $C_L$, one is connected to an output line 302, and the other is connected to a lower bit output line 303 of the resistance divided DAC 301 corresponding to the lower 2 bits of the digital signal (lower bit correspondence resistance divided DAC (R-DAC)).

The R-DAC 301 has 4 resistors $R_L[1]$, $R_L[2]$, $R_L[3]$, and $R_L[4]$, and 4 switches SW[1], SW[2], SW[3], and Sw[4].

The 4 resistors all have the same resistance value, expressed by $R_L[1]$=$R_L[2]$=$R_L[3]$=$R_L[4]$ (where R is a constant).

Further, the 4 resistors $R_L[1]$, $R_L[2]$, $R_L[3]$, and $R_L[4]$ are all connected in series, and the resistors $R_L[1]$ and $R_L[4]$ positioned at the ends of the connection are connected to an electric power source A and an electric power source B, respectively.

The wirings are connected such that the electric potential of the electric power source A and the electric potential of each resistor connected in series are imparted to the lower bit output line 303 through the $2^2$ switches SW[1], SW[2], SW[3], and SW[4], respectively. Note that, differing from FIG. 6, the wirings may be connected such that the electric potential of the electric power source B and the electric potential of each resistor connected in series are imparted to the lower bit output line 303 through the 4 switches SW[1], SW[2], SW[3], and SW [4], respectively.

Of the two electrodes of each of the upper bit correspondence capacitors, one of the electrodes is connected to the electric power source A or the electric power source B through, in order from the capacitor corresponding to the lowest of the upper n−2 bits, the n−2 switches SW[5], SW[6], ..., SW[n+1], SW[n+2], respectively. Further, the other electrodes are all connected to the output wiring 302.

Whether one of the electrodes of the upper bit correspondence capacitors is connected to the electric power source A or to the electric power source B is determined by information contained in each bit of the upper n−2 bits input to the switches SW[5], SW[6], ..., SW[n+1], SW[n+2], respectively.

Further, the output wiring 302 is connected to a reset electric power source through a reset switch $SW_R$. Note that the electric potential $V_R$ of the reset electric power source and the electric potential $V_A$ of the electric power source A may be the same, and they may also be different. Further, the electric potential $V_R$ of the reset electric power source and the electric potential $V_B$ of the electric power source B may be the same, and they may also be different. The reset switch $SW_{R-}$ controls switching in accordance with a reset signal (Res).

Note that the output wiring 302 has a wiring capacitance ($C_W$), and that reference symbol $V_G$ denotes a ground electric potential. However, it is not always necessary that the wiring capacitance be formed between ground and the output wiring 302, but it may also be formed between an electric power source other than ground and the output wiring.

Next, operation of the DAC of the present invention shown in FIG. 6 can be explained by dividing it into reset periods $T_R$ and write in periods $T_A$. The operation of each switch is the same as that shown by Embodiment Mode 1, and therefore its explanation is omitted here. The electric potential of the analog signal input to the output line has linearity with respect to the digital signal bits by having the digital signal control the operation of each switch.

In accordance with the above structure, a DAC corresponding to a digital signal having a high number of bits can be formed, without losing linearity, while maintaining an advantage of capacitance division to suppress the relative amount of surface area while operating at high speed.

A case in which m=2 is discussed in Embodiment 1, but the present invention is not limited to this. It is possible for a designer to appropriately select the value of m.

Embodiment 2

An example of a case in which m=2 in the DAC of the present invention shown in FIG. 5 is explained in Embodiment 2.

Figure 7:
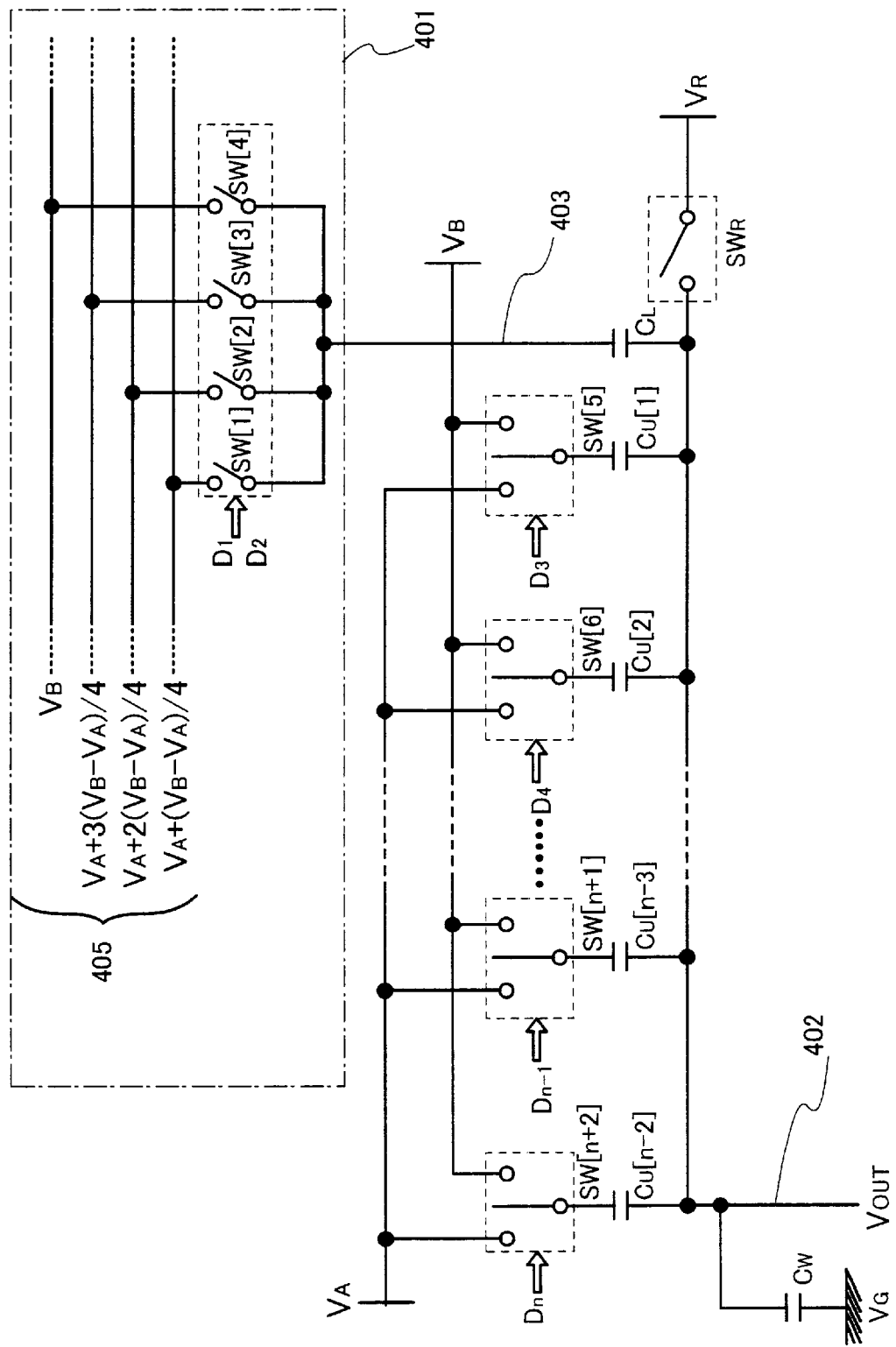
FIG. 7 is a diagram showing a structure of a DAC having the structure of Embodiment 2.

A structure of a DAC of Embodiment 2 is shown in FIG. 7. The DAC shown in FIG. 7 converts an n-bit digital signal into an analog signal by converting the lower 2 bits of the digital signal in a lower bit correspondence selector circuit 401 into a lower bit correspondence analog signal.

Further, the DAC has one lower bit correspondence capacitor ($C_L$) corresponding to the lower 2 bits, and n−2 upper bit correspondence capacitors ($C_U[1]$, $C_U[2]$, $C_U[3]$, ..., $C_U[n-3]$, and $C_U[n-2]$).

The capacitance value of the lower bit correspondence capacitor $C_L$ is denoted by $C_L$=C (where C is a constant), and the capacitance values of the upper bit correspondence capacitors $C_U$ are denoted by, in order from the lowest of the upper bits, $C_U[1]$=C, $C_U[2]$=2C, $C_U[3]$=$2^2$C, ..., $C_{U[n-3]}$=$2^{n-4}$C, and $C_U[n-2]$=$2^{n-3}$C.

Of the two electrodes of the lower bit correspondence capacitor $C_L$, one is connected to an output line 402, and the other is connected to a lower bit output line 403 of the selector circuit 401 corresponding to the lower bits of the digital signal.

The lower bit correspondence selector circuit 401 has 4 gradation voltage lines 405, and 4 switches SW[1], SW[2], SW[3], and SW[4].

The electric potentials of the 4 gradation voltage lines 405 are expressed by $V_A+(V_B-V_A)/4$, $V_A+2(V_B-V_A)/4$, $V_A+3(V_B-V_A)/4$, and $V_B$, respectively.

Further, wirings are connected such that the electric potentials of each of the gradation voltage lines 405 are imparted to the lower bit output line 403 through the 4 switches SW[1], SW[2], SW[3], ..., and Sw[4], respectively.

Of the two electrodes of each of the upper bit correspondence capacitors, one of the electrodes is connected to an electric power source A or an electric power source B through, in order from the capacitor corresponding to the lowest of the upper n−2 bits, the n−2 switches SW[5], SW[6], ..., SW[n+1], SW[n+2], respectively. Further, the other electrodes are all connected to the output wiring 402.

Whether one of the electrodes of the upper bit correspondence capacitors is connected to the electric power source A or to the electric power source B is determined by each bit of the upper n−2 bits input to the n−2 switches SW[5], SW[6], ..., SW[n+1], SW[n+2], respectively.

Further, the output wiring 402 is connected to a reset electric power source through a reset switch $SW_R$. Note that the electric potential $V_R$ of the reset electric power source and the electric potential $V_A$ of the electric power source A may be the same, and they may also be different. Further, the electric potential $V_R$ of the reset electric power source and the electric potential $V_B$ of the electric power source B may be the same, and they may also be different. The reset switch $SW_R$ controls switching in accordance with a reset signal (Res).

Note that the output wiring 402 has a wiring capacitance ($C_W$), and that reference symbol $V_G$ denotes a ground electric potential. However, it is not always necessary that the wiring capacitance be formed between the ground and the output wiring 402; it may also be formed between an electric power source other than ground and the output wiring.

Operation of the DAC of the present invention shown in FIG. 7 can be explained by dividing it into reset periods $T_R$ and write in periods $T_A$. The operation of each switch is the same as the case shown by Embodiment Mode 1, and therefore such explanation is omitted here. The electric potential of the analog signal input to the output line has linearity with respect to the digital signal bits by having the digital signal control the operation of each switch.

In accordance with the above structure, a DAC corresponding to a digital signal having a high number of bits can be formed, without losing linearity, while maintaining the ability to suppress the relative amount of surface area while operating at high speed, and an advantage of capacitance division.

Embodiment 3

An example of a switch used in a DAC of the present invention is shown in Embodiment 3.

Figure 8:
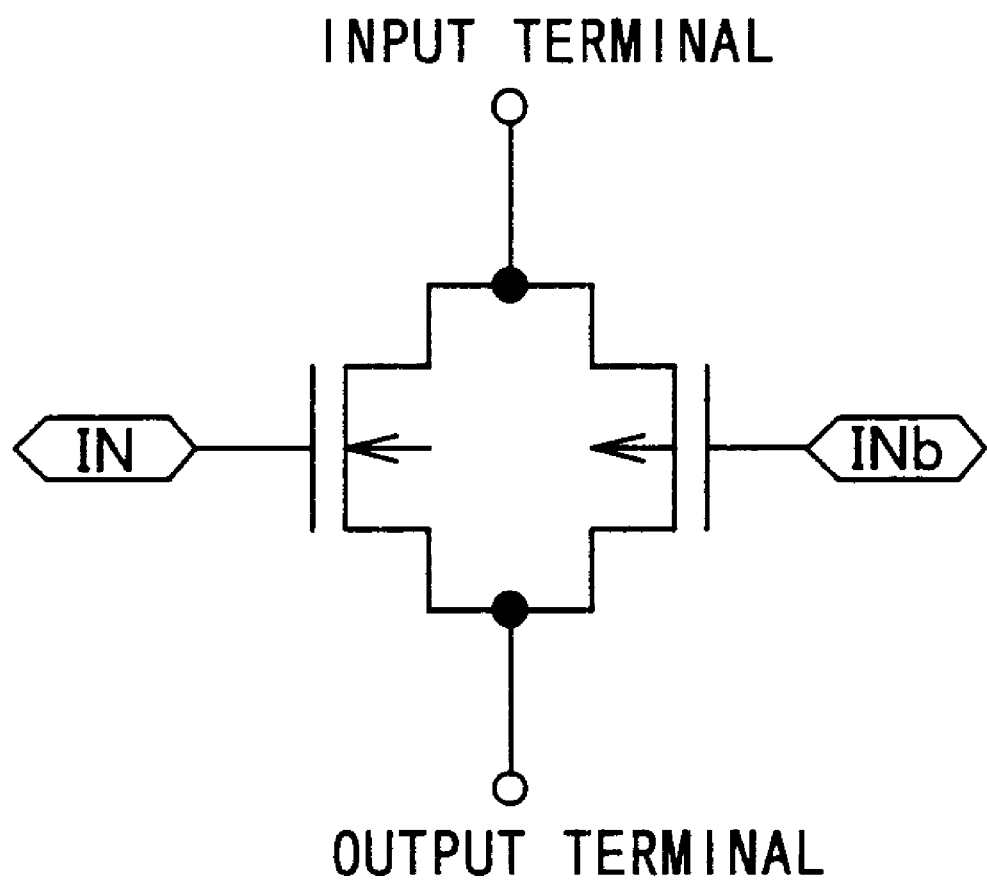
FIG. 8 is a circuit diagram of a switch used in a DAC of Embodiment 3.

A switch in accordance with Embodiment 3 has an n-channel TFT and a p-channel TFT, as shown in FIG. 8. A digital signal, and a signal having a polarity which is the inverse of the digital signal (inverse digital signal) are input to IN and to INb, respectively.

An electric potential imparted to an input terminal by the digital signal and the inverse digital signal input to IN and INb, respectively, is sampled and then imparted to an output terminal.

Note that the switch used in the DAC of the present invention is not limited to the structure shown in FIG. 8.

Further, it is possible to implement the constitution of Embodiment 3 by freely combining it with Embodiment 1 or Embodiment 2.

Embodiment 4

An example of a process of manufacturing a TFT used in a DAC of the present invention is explained in Embodiment 4. Note that although processes for manufacturing a p-channel TFT and an n-channel TFT are only shown in FIGS. 9A to 9E, it is possible to produce all transistors used by the present invention based on the processes in FIGS. 9A to 9E.

Figure 9A:
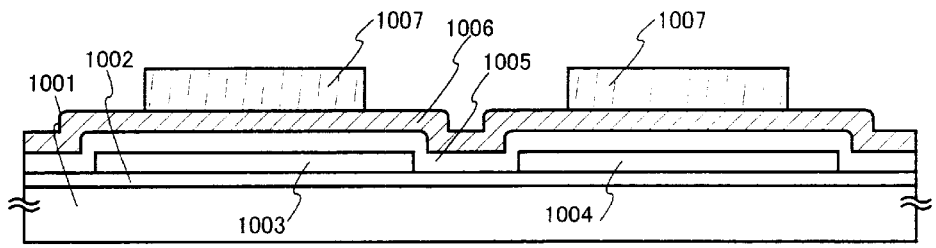
FIGS. 9A to 9E are diagrams showing a process of manufacturing a TFT of Embodiment 4.

In addition to a glass substrate such as barium borosilicate glass or aluminum borosilicate glass, typically Corning Corp. #7059 or #1737, a plastic substrate having no optical anisotropy such as polyethelylene terephthalate (PET), polyethylene naphthalate (PEN), or polyethel sulfon (PES) can be used in a substrate 1001 in FIG. 9A. Further, a quartz substrate may also be used. If heat treatment is performed in advance at a temperature on the order of 10 to 20° C. less than the distortion point of the glass when using a glass substrate, then changes in shape of the glass substrate in subsequent processes can be prevented.

A base film 1002 having a thickness of 10 to 200 nm is formed from an insulating film such as a silicon oxide film, a silicon nitride film, or a silicon nitride oxide film, on the surface of the substrate 1001 on which TFTs will be manufactured, in order to prevent impurity element diffusion. The base film may be formed by one layer of the insulating film, and may also be formed by a plurality of layers.

Island shape semiconductor layers 1003 and 1004 are formed from a crystalline semiconductor film in which a semiconductor film having an amorphous structure is crystallized by a method such as laser annealing, thermal annealing, or rapid thermal annealing (RTA). Further, a crystalline semiconductor film formed by a method such as sputtering, plasma CVD, or thermal CVD may also be used. Alternatively, the crystalline semiconductor layers 1003 and 1004 can also be formed by a crystallization method using a catalytic element, in accordance with a technique disclosed by Japanese Patent Application Laid-open No. Hei 7-130652. In this crystallization process, it is preferable to first remove hydrogen contained in the amorphous semiconductor layer. If crystallization is performed after the amount of contained hydrogen is made equal to or less than 5 atom % by performing heat treatment at 400 to 500° C. for approximately 1 hour, then roughness of the film surface can be prevented. Whichever method is used, the crystalline semiconductor film thus formed is selectively etched, forming the island shape semiconductor layers 1003 and 1004 in predetermined locations.

Alternatively, an SOI (silicon on insulator) substrate in which a single crystal silicon layer is formed on the substrate 1001 may also be used. There are many types known depending upon the structure and method of manufacture of the SOI substrate, and typically substrates such as SIMOX (separation by implanted oxygen), ELTRAN (epitaxial layer transfer, a trademark of Canon Corp.), or Smart-Cut (a trademark of SOITEC Corp.) can be used. Of course it is also possible to use other SOI substrates.

A gate insulating film having a thickness of 40 to 150 nm is formed from an insulating film containing silicon by a method such as plasma CVD, sputtering, or reduced pressure CVD. For example, it may be formed from a film such as a silicon oxide film, a silicon nitride film, or a silicon nitride oxide film. This is taken as a gate insulating film 1005 having a first shape. A conductive layer 1006 is then formed on the first shape gate insulating film 1005 in order to form gate electrodes. It is preferable to form the conductive layer 1006 from a conductive material having resistance to heat. It may be formed from a single layer, and it may also have a lamination structure made from a plurality of layers, such as two layers or three layers, when necessary. For example, the conductive layer 1006 may be formed by an element selected from the group consisting of tungsten (W), tantalum (Ta), titanium (Ti), and molybdenum (Mo), or from an alloy with the above elements as constituents, or from an alloy film of a combination of the above elements. Further, the conducting layer may be formed into a lamination structure with a nitride compound of the above elements, such as tungsten nitride (WN), tantalum nitride (TaN), titanium nitride (TiN), or molybdenum nitride (MoN), or a silicide compound such as tungsten silicide, tantalum silicide, titanium silicide, or molybdenum silicide. A first shape mask 1007 is then formed. The first shape mask 1007 is formed by a photolithography technique using a resist material.

Figure 9B:
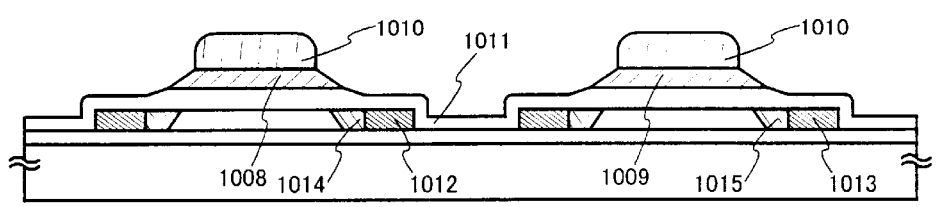

Etching of the conducting layer 1006 is performed next, as shown by FIG. 9B. The etching process is performed using a dry etching method, preferably by using an ICP etching apparatus. A gas mixture of $CF_4$ and $Cl_2$ is used as an etching gas, and a bias voltage is applied to the substrate. At the very least, conducting layers 1008 and 1009 having a first tapered shape are formed on the island shape semiconductor layers 1003 and 1004. The shape of the tapered portion can be changed in accordance with the etching gas mixture ratio, with the etching pressure, and with the bias voltage applied to the substrate. The bias voltage applied to the substrate is most suitable for controlling the tapered shape.

Dry etching is performed by elements such as fluorine (F) and chlorine (Cl), or by neutral particles or ionic particles of molecules containing fluorine or chlorine. Normally, etching proceeds in an isotropic manner if it is controlled by neutral seeds, and a tapered shape is difficult to form. Etching proceeds in an anisotropic manner by applying a positive or a negative bias voltage to the substrate. Etching for forming a tapered shape is performed by applying a bias voltage to the substrate, and by etching the resist at the same time, with the difference in etching rate between the film and the resist (also referred to as selective ratio, and expressed as the etching rate of the product to be processed/etching rate of resist) used as a value in a certain fixed range. By first making an appropriate resist shape, and then performing an etching gradually from an edge portion of the resist, a tapered shape can be formed in the film underneath. The shape of the first shape mask 1007 also changes, forming a second shape mask 1010. Further, the surface of the gate insulating film 1005 under the conductive layer 1006 is exposed as etching proceeds, and the gate insulating film is also etched to a certain extent from its surface, forming a second shape gate insulating film 1011.

The resist 1010 is then used as a mask, and a first doping process is performed. An impurity element is added to impart n-type conductivity to the island shape semiconductor layers 1003 and 1004. An ion doping method or an ion injection method in which the impurity element is ionized, accelerated by an electric field, and then injected into the semiconductor layers, is used for the doping process. An impurity element imparting n-type conductivity passes through the gate insulating film and is added to the semiconductor layers 1003 and 1004 below. A portion of the n-type conductivity imparting impurity element passes through edge portions of the first shape gate electrodes 1008 and 1009, and their vicinity, and can be added to the semiconductor layers below.

First impurity regions 1012 and 1013 contain the single conductivity type impurity element at a concentration of $1 \times 10^{20}$ to $1 \times 10^{21}$ atoms/cm$^3$. Further, the concentration of the impurity element added to the semiconductor layer in second impurity regions 1014 and 1015 is low compared to that of the first impurity regions 1012 and 1013 by the amount in which the thickness of the second shape gate insulating film 1011 increases. A uniform concentration distribution is not always able to be obtained within the second impurity element regions 1014 and 1015, but the impurity element is added so as to fall within a range of $1 \times 10^{17}$ to $1 \times 10^{20}$ atoms/cm$^3$.

The second impurity regions 1014 and 1015 are formed under the gate insulating film 1011 and the tapered portions of the conductive layers 1008 and 1009. The concentration distribution of the impurity element in the second impurity regions 1014 and 1015 decreases as distance from the first impurity regions 1012 and 1013 increases. The ratio of the decrease varies in accordance with conditions of the acceleration voltage and the dosage during ion doping, with the angle of the tapered portion, and with the thickness of the first shape gate electrodes 1008 and 1009.

Figure 9C:
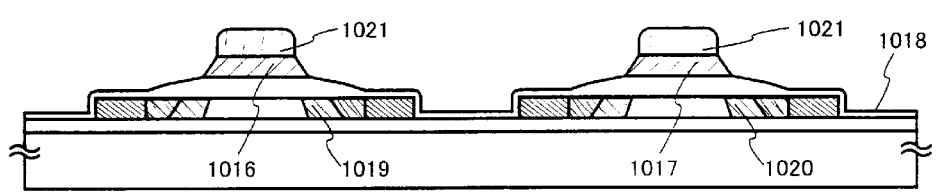

A second etching process is performed next, as shown in FIG. 9C. In the second etching process, the first shape gate electrodes 1008 and 1009 are etched so as to make the width in a channel longitudinal direction shorter. The method of etching is the same as that of the first etching process, and an ICP etching apparatus is used. A gas mixture of $CF_4$ and $Cl_2$ is used as an etching gas, and a bias voltage is applied to the substrate, forming a second shape gate electrodes 1016 and 1017. A portion of the base gate insulating film 1011 is etched from its surface in the second etching process, forming a second shape gate insulating film 1018. Tapered portions are also formed in edge portions of the conductive layers 1016 and 1017 having the second tapered shape.

A second doping process is then performed with the resist 1021 used as a mask, and the n-type conductivity imparting impurity element is added to the island shape semiconductor layers 1003 and 1004. In this case, a portion of the impurity element can pass through the edge portions of the second shape gate electrodes 1016 and 1017, and their vicinity, and can be added to the semiconductor layer below.

The second doping process is performed so that the single conductivity type impurity element is contained at a concentration of $1 \times 10^{16}$ to $5 \times 10^{15}$ atoms/cm$^3$. The single conducting type impurity element is added in this process to the first impurity regions 1012 and 1013, and to the second impurity regions 1014 and 1015 formed by the first doping process, but the amount added thereto is low, and therefore its influence can be ignored. Newly formed third impurity regions 1019 and 1020 are made to contain the single conducting type impurity element at a concentration of $1 \times 10^{16}$ to $5 \times 10^{18}$ atoms/cm$^3$. In the third impurity regions 1019 and 1020 is reduced the concentration of the impurity element added to the semiconductor layer by the amount in which the thickness of the second tapered shape gate electrodes 1016 and 1017 increase. Although a uniform concentration distribution cannot necessarily be obtained within the third impurity regions 1019 and 1020, the impurity element is made to be contained within the above concentration range.

The third impurity regions 1019 and 1020 are formed beneath the second shape gate insulating film 1018, and beneath the tapered portions of the second shape gate electrodes 1016 and 1017. Their concentration distributions decrease as distances from the first impurity regions 1012 and 1013 increase. The second shape gate electrodes 1016 and 1017 are used as gate electrodes. With the edge portions of the gate electrodes given a tapered shape, and by doping the impurity element through the tapered portions, impurity regions can thus be formed in the semiconductor layers existing under the tapered portion in which the concentration of the impurity element changes gradually. The present invention actively utilizes this impurity region. Forming this type of impurity region relieves a high electric field that develops in the vicinity of the drain region, and prevents the generation of hot carriers. Deterioration of the TFT can thus be prevented.

Figure 9D:
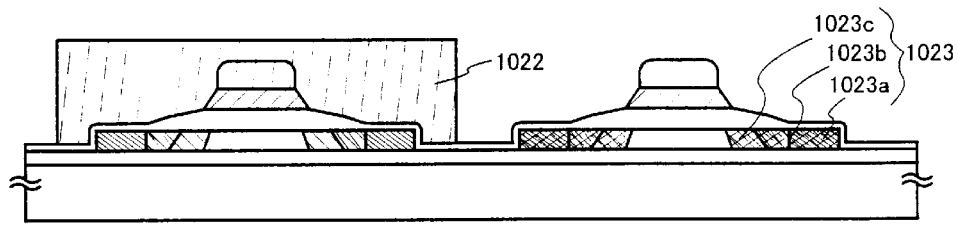

The island shape semiconductor layer 1003 is then covered with a resist mask 1022 as shown in FIG. 9D, and an impurity element which imparts p-type conductivity is added to the island shape semiconductor layer 1004. The second shape gate electrode 1017 acts as a mask in this case as well, and the p-type conductivity imparting impurity element is added, forming an impurity region in a self-aligning manner. An impurity region 1023 formed here is formed by ion doping method using diborane ($B_2H_6$). The concentration of the p-type conductivity imparting impurity element of the impurity region 1023 is set so as to be from $2 \times 10^{20}$ to $2 \times 10^{21}$ atoms/cm$^3$.

However, the impurity region 1023 can be seen in detail to be divided into three regions containing the impurity element which impart n-type conductivity. A fourth impurity region 1023a contains the n-type conductivity imparting element at a concentration of $1\times10^{20}$ to $1\times10^{21}$ atoms/cm$^3$, a fifth impurity region 1023b contains the n-type conductivity imparting element at a concentration of $1\times10^{17}$ to $1\times10^{20}$ atoms/cm$^3$, and a sixth impurity region 1023c contains the n-type conductivity imparting element at a concentration of $1\times10^{16}$ to $5\times10^{18}$ atoms/cm$^3$. However, the concentration of the p-type conductivity impurity element in the impurity regions 1023b and 1023c is made to be equal to or greater than $1\times10^{19}$ atoms/cm$^3$, and the concentration of the p-type conductivity imparting impurity element in the fourth impurity region 1023a is made to be from 1.5 to 3 times the concentration of the impurity element which imparts n-type conductivity. As a result, there develops no problem in using the fourth impurity region 1023b as a source region or a drain region of a p-channel TFT Further, a portion of the sixth impurity region 1023c is formed so as to overlap with of the second shape gate electrode 1017.

Thus a first impurity region 1024, which becomes a source region or a drain region, a second impurity region 1025, which forms an LDD region not overlapping the gate electrode, a third impurity region 1026 which forms an LDD region a portion of which overlaps with the gate electrode, and a channel forming region 1027 are formed in the island shape semiconductor layer 1003. Further, a first impurity region 1028, which becomes a source region or a drain region, a second impurity region 1029, which forms an LDD region not overlapping the gate electrode, a third impurity region 1030 which forms an LDD region a portion of which overlaps with the gate electrode, and a channel forming region 1031 are formed in the island shape semiconductor layer 1004.

Figure 9E:
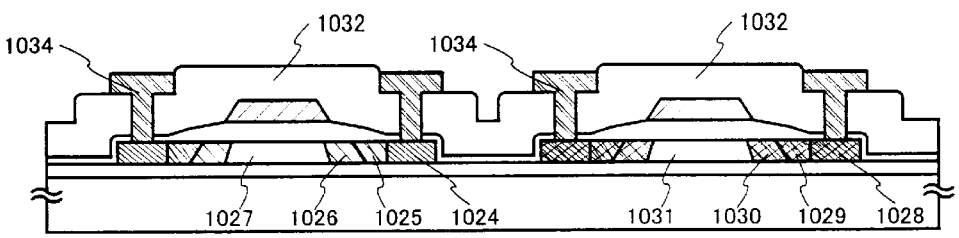

An interlayer insulating film 1032 and a wiring 1034 for forming contact with a source region or a drain region may also be formed next when necessary, as shown in FIG. 9E.

Note that the transistors used in the DAC of the present invention may be transistors formed using single crystal silicon, and may also be thin film transistors that use polysilicon or amorphous silicon.

It is possible to implement Embodiment 4 by freely combining it with any of Embodiments 1 to 3.

Embodiment 5

A semiconductor device having a DAC of the present invention can be used in various electronic devices.

Examples of electronic devices which use the DAC of the present invention include: video cameras; digital cameras, goggle type displays (head mounted displays); navigation systems; audio playback devices (such as car audio systems and audio component systems); notebook personal computers; game machines; portable information terminals (such as mobile computers, portable telephones, portable game machines, and electronic books); and image reproducing devices provided with a recording medium (specifically, devices provided with displays for displaying images when playing back a recording medium such as a digital video disk (DVD)). Specific examples of these electronic devices are shown in FIGS. 10A to 10H.

Figure 10A:
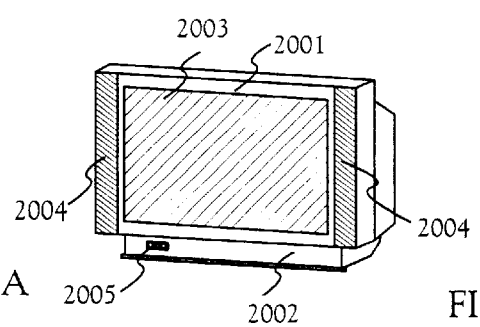
FIGS. 10A to 10H are diagrams of electronic devices using a DAC of Embodiment 5.

FIG. 10A is a display device, and contains parts such as a frame 2001, a support stand 2002, a display portion 2003, a speaker portion 2004, and a video input terminal 2005. The DAC of the present invention can be used in the display portion 2003 and in other control circuits. Note that display devices include all information display devices for, for example, personal computers, television broadcast transmitter-receivers, and advertisement displays.

Figure 10B:
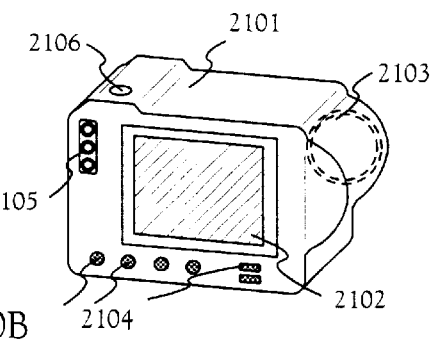

FIG. 10B is a digital still camera, which contains parts such as a main body 2101, a display portion 2102, an image receiving portion 2103, operation keys 2104, external connection ports 2105, and a shutter 2106. The DAC of the present invention can be used in the display portion 2102 and in other control circuits.

Figure 10C:
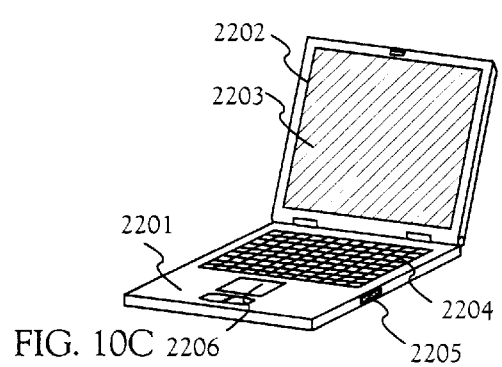

FIG. 10C is a notebook personal computer, which contains parts such as a main body 2201, a frame 2202, a display portion 2203, a keyboard 2204, external connection ports 2205, and a pointing mouse 2206. The DAC of the present invention can be used in the display portion 2203 and in other control circuits.

Figure 10D:
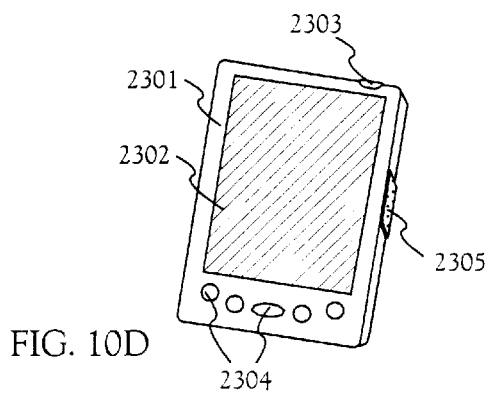

FIG. 10D is a mobile computer, which contains parts such as a main body 2301, a display portion 2302, switches 2303, operation keys 2304, and an infrared port 2305. The DAC of the present invention can be used in the display portion 2302 and in other control circuits.

Figure 10E:
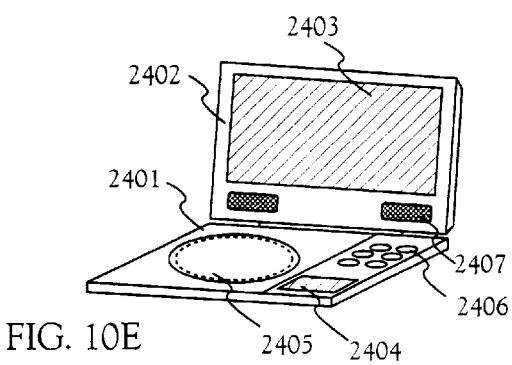

FIG. 10E is a portable image reproducing device image reproducing device provided with a recording medium (specifically, a DVD playback device), which contains parts such as a main body 2401, a frame 2402, a display portion A 2403, a display portion B 2404, a recording medium (such as a DVD) read-in portion 2405, operation keys 2406, and a speaker portion 2407. The display portion A 2403 mainly displays image information, and the display portion B 2404 mainly displays character information, and the DAC of the present invention can be used in the display portion A 2403 and in the display portion B 2404, as well as in other control circuits. Note that family game machines and the like are included in the category of image reproducing devices provided with a recording medium.

Figure 10F:
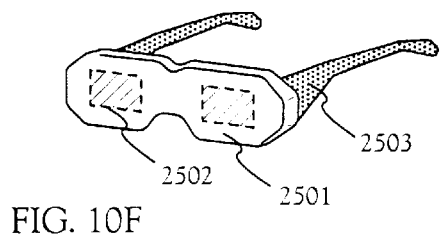

FIG. 10F is a goggle type display (head mounted display), which contains a main body 2501, a display portion 2502, and arm portions 2503. The DAC of the present invention can be used in the display portion 2502 and in other control circuits.

Figure 10G:
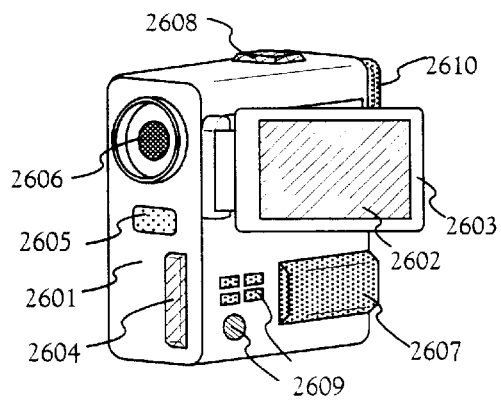

FIG. 10G is a video camera, which contains parts such as a main body 2601, a display portion 2602, a frame 2603, external connection ports 2604, a remote control signal receiving portion 2605, an image receiving portion 2606, a battery 2607, an audio input portion 2608, operation keys 2609 and an eyepiece portion 2610. The DAC of the present invention can be used in the display portion 2602 and in other control circuits.

Figure 10H:
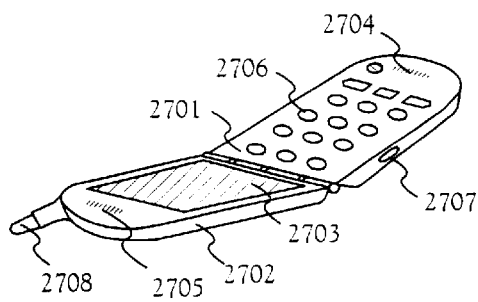
Figure 11:
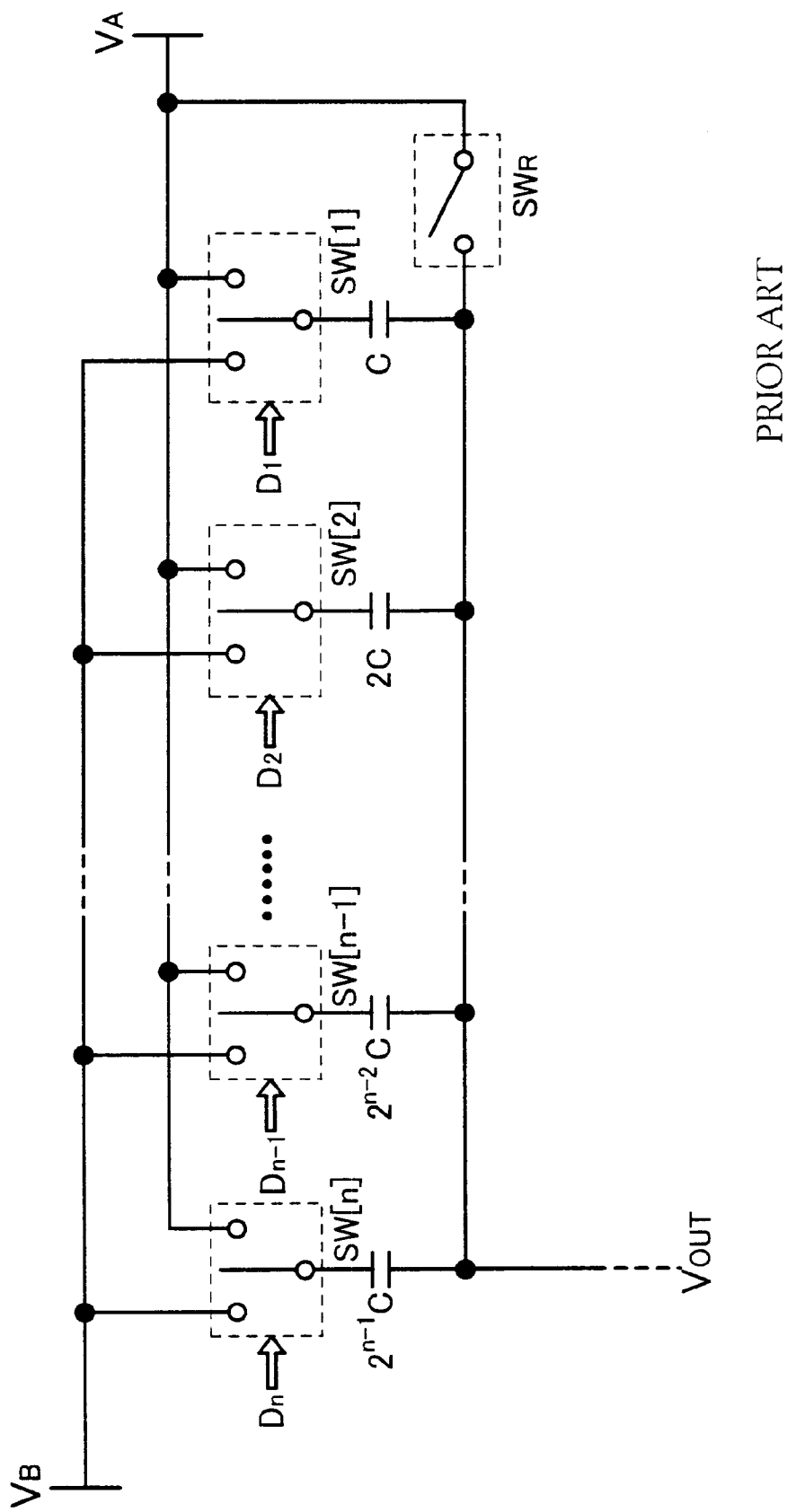
FIG. 11 is a diagram showing a structure of a conventional capacitance divided DAC.
Figure 12A:
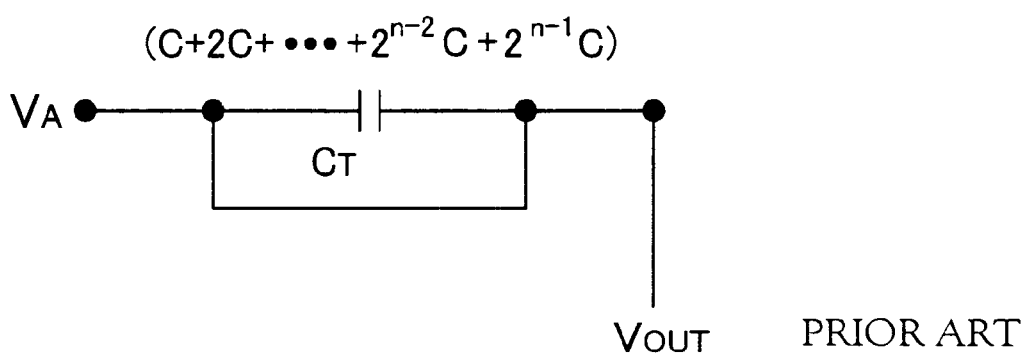
FIGS. 12A and 12B are equivalent circuit diagrams of conventional capacitance divided DACs.
Figure 12B:
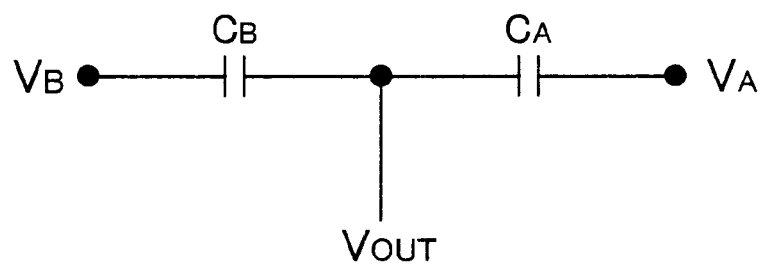

FIG. 10H is a portable telephone, which contains parts such as a main body 2701, a frame 2702, a display portion 2703, an audio input portion 2704, an audio output portion 2705, operation keys 2706, an external connection portion 2707, and an antenna 2708. The DAC of the present invention can be used in the display portion 2703 and in other control circuits.

Further, the aforementioned electronic devices often display information received through electronic communication lines such as the Internet and CATV (cable television), and opportunities for displaying moving pictures in particular have increased. The DAC of the present invention is capable of high speed operation, is capable of converting a high bit number of digital signal into an analog signal, and can ensure linearity of the output analog signal. The DAC of the present invention is therefore valuable.

The applicable range of the DAC of the present invention is thus extremely wide, and the DAC of the present invention can be used in electronic equipment in all fields.

Further, the electronic devices of Embodiment 5 may use DACs having any of the structures shown in Embodiments 1 to 4.

In accordance with the above structure, a DAC corresponding to a digital signal having a high number of bits can be formed, without losing linearity, while maintaining an advantage of capacitance division to suppress the relative amount of surface area, while operating at high speed.

What is claimed is:

1. A D/A converter circuit for converting n-bits digital signal to analog signals,
   wherein n is a natural number,
   wherein the D/A converter circuit has n−m+1 capacitors,
   wherein m is a natural number less than n,
   wherein electrical charging of one capacitor from among n−m+1 capacitors is controlled by lower m bits from among n bits of the digital signals,
   wherein electrical charging of remaining n−m capacitors from among the n−m+1 capacitors is controlled by upper n−m bits from among the n bits of the digital signals.

2. A D/A converter circuit for converting n-bits digital signals to analog signals,
   wherein n is a natural number,
   wherein the D/A converter circuit has n−m+1 capacitors,
   where m is a natural number less than n,
   wherein electrical charging of one capacitor having a capacitance value of C from among the n−m+1 capacitors is controlled by lower m bits from among the n bits of the digital signals,
   wherein C is a constant,
   wherein electrical charging of remaining n−m capacitors from among the n−m+1 capacitors is controlled by upper n−m bits from among the n bits of the digital signals;
   wherein the remaining n−m capacitors have capacitance values expressed by $C, 2C, 2^2C, \ldots, 2^{n-m-1}C$, respectively.

3. A D/A converter circuit for converting n-bits digital signals to analog signals,
   wherein n is a natural number,
   wherein the D/A converter circuit has n−m+1 capacitors and $2^m$ resistors,
   wherein m is a natural number less than n,
   wherein electric charges determined by lower m bits from among n bits of the digital signals and the $2^m$ resistors are supplied to one capacitor from among the n−m+1 capacitors,
   wherein electric charges determined by upper n−m bits from among the n bits of the digital signals are supplied to remaining n−m capacitors from among the n−m+1 capacitors.

4. A D/A converter circuit for converting n-bit digital signals to analog signals,
   wherein n is a natural number,
   wherein the D/A converter circuit has n−m+1 capacitors and $2^m$ resistors,
   wherein m is a natural number less than n,
   wherein electric charges determined by lower m bits from among the n bits of the digital signals and the $2^m$ resistors are supplied to one capacitor from among the n−m+1 capacitors,
   wherein resistance values of all of the $2^m$ resistors are same,
   wherein electric charges determined by upper n−m bits from among the n bits of the digital signals are supplied to remaining n−m capacitors from among the n−m+1 capacitors.

5. A D/A converter circuit according to claim 3, wherein the $2^m$ resistors are connected in series.

6. A D/A converter circuit according to claim 5,
   wherein each of two resistors from among the $2^m$ resistors has a terminal which is not connected to another resistor,
   wherein the terminal of each of the two resistors is connected to a low voltage side electric power source or a high voltage side electric power source.

7. A D/A converter circuit for converting n-bits digital signals to analog signals,
   wherein n is a natural number,
   wherein the D/A converter circuit has n−m+1 capacitors and $2^m$ gradation voltage lines,
   wherein m is a natural number less than n,
   wherein one of the $2^m$ gradation voltage lines is selected by lower m bits from among the n bits of the digital signals,
   wherein electric charges are supplied to one capacitor having a capacitance value of C from among the n−m+1 capacitors by an electric potential of the selected one of gradation voltage lines,
   wherein C is a constant,
   wherein electric charging of remaining n−m capacitors from among the n−m+1 capacitors is controlled by upper n−m bits of from among the n bit the digital signals,
   wherein the remaining n−m capacitors have capacitance values expressed by $C, 2C, 2^2C, \ldots, 2^{n-m-1}C$, respectively.

8. A D/A converter circuit according to claim 1,
   wherein the amount of electric charges supplied to the n−m+1 capacitors in a reset period is always maintained at a specific value.

9. A semiconductor device having the D/A converter circuit according to claim 1.

10. A semiconductor device according to claim 9,
    wherein the semiconductor device is one selected from the group consisting of a display device, a digital still camera, a notebook personal computer, a mobile computer, a DVD player, a head mounted display, a video camera, and a portable telephone.

11. A D/A converter circuit according to claim 2,
    wherein the amount of electric charges supplied to the n−m+1 capacitors in a reset period is always maintained at a specific value.

12. A semiconductor device having the D/A converter circuit according to claim 2.

13. A semiconductor device according to claim 12,
    wherein the semiconductor device is one selected from the group consisting of a display device, a digital still camera, a notebook personal computer, a mobile computer, a DVD player, a head mounted display, a video camera, and a portable telephone.

14. A D/A converter circuit according to claim 3,
    wherein the amount of electric charges supplied to the n−m+1 capacitors in a reset period is always maintained at a specific value.

15. A semiconductor device having the D/A converter circuit according to claim 3.

16. A semiconductor device according to claim 15, wherein the semiconductor device is one selected from the group consisting of a display device, a digital still camera, a notebook personal computer, a mobile computer, a DVD player, a head mounted display, a video camera, and a portable telephone.

17. A D/A converter circuit according to claim 4, wherein the $2^m$ resistors are connected in series.

18. A D/A converter circuit according to claim 17, wherein each of two resistors from among the $2^m$ resistors has a terminal which is not connected to another resistor, wherein the terminal of each of the two resistors is connected to a low voltage side electric power source or a high voltage side electric power source.

19. A D/A converter circuit according to claim 4, wherein the amount of electric charges supplied to the n−m+1 capacitors in a reset period is always maintained at a specific value.

20. A semiconductor device having the D/A converter circuit according to claim 4.

21. A semiconductor device according to claim 20, wherein the semiconductor device is one selected from the group consisting of a display device, a digital still camera, a notebook personal computer, a mobile computer, a DVD player, a head mounted display, a video camera, and a portable telephone.

22. A D/A converter circuit according to claim 7, wherein the amount of electric charges supplied to the n−m+1 capacitors in a reset period is always maintained at a specific value.

23. A semiconductor device having the D/A converter circuit according to claim 7.

24. A semiconductor device according to claim 23, wherein the semiconductor device is one selected from the group consisting of a display device, a digital still camera, a notebook personal computer, a mobile computer, a DVD player, a head mounted display, a video camera, and a portable telephone.

* * * * *